US006722026B1

(12) United States Patent
Lent

(10) Patent No.: US 6,722,026 B1
(45) Date of Patent: Apr. 20, 2004

(54) APPARATUS AND METHOD FOR REMOVABLY ADHERING A SEMICONDUCTOR SUBSTRATE TO A SUBSTRATE SUPPORT

(75) Inventor: Matthew Harris Lent, Livermore, CA (US)

(73) Assignee: KLA-Tencor Corporation, San Jose, CA (US)

( * ) Notice: Subject to any disclaimer, the term of this patent is extended or adjusted under 35 U.S.C. 154(b) by 139 days.

(21) Appl. No.: 09/962,566

(22) Filed: Sep. 25, 2001

(51) Int. Cl.⁷ ................................................. H05K 3/36
(52) U.S. Cl. ............................. 29/830; 29/760; 29/834; 29/900; 156/290; 279/128; 428/86
(58) Field of Search ........................... 29/759, 760, 830, 29/831, 834, 900; 83/941, 929.1; 279/128; 156/60, 290, 292, 297; 428/85, 86, 179, 223

(56) References Cited

U.S. PATENT DOCUMENTS 5,858,537 A * 1/1999 Brown et al. ................ 428/408
6,568,989 B1 * 5/2003 Molnar ............................ 451/5

OTHER PUBLICATIONS

Autumn, Kellar, et al., "Adhesive Force of a Single Gecko Foot–Hair", *Nature*, vol. 405, Jun. 8, 2000, pp. 681–685.
Chui, Glennda, "Climbing the Walls *Gecko's* Clinging Secret Offers Potential for Advances in Adhesives, Robotics and Chip–Making", *San Jose Mercury News*, Science & Technology Section, Morning Final Edition, Jun. 13, 2000, p. 1F.

"Gecko Foot Hair Research Feeds Adhesive Development", *MRS Bulletin*, Aug., 2000.

\* cited by examiner

*Primary Examiner*—Peter Vo
*Assistant Examiner*—Donghai D. Nguyen
(74) *Attorney, Agent, or Firm*—John P. Taylor

(57) ABSTRACT

A process and apparatus is disclosed capable of removably adhering a semiconductor substrate to a substrate support in a sub-atmospheric environment using a plurality of individual fibers, each mounted at one end adjacent the substrate support, and each having a loose end. When the portions of the fiber adjacent the loose fiber ends are each brought into contact with the under surface of the substrate, Van der Waals forces are exerted between the substrate and the fibers to urge the substrate toward the underlying substrate support. In a preferred embodiment, the substrate and portions of the fiber adjacent the loose fiber ends are first vertically brought into physical contact with one another, and then a horizontal force is applied to horizontally move, with respect to one another, the substrate and the portions of the fibers adjacent the loose fiber ends. After application of the horizontal force, a vertical force is applied between the substrate and the fibers of sufficient strength to urge the substrate and the fibers away from one another without breaking contact between the substrate and the portions of the fiber adjacent the fiber ends to thereby place tension on the substrate to urge the substrate to lie flat against the underlying substrate support.

20 Claims, 5 Drawing Sheets

APPARATUS AND METHOD FOR REMOVABLY ADHERING A SEMICONDUCTOR SUBSTRATE TO A SUBSTRATE SUPPORT

BACKGROUND OF THE INVENTION

1. Field of the Invention

This invention relates to integrated circuit structures. More particularly, this invention relates to a chucking structure useful for securing a semiconductor substrate to a substrate support during the formation and/or testing of an integrated circuit structure thereon, particularly in a vacuum environment.

2. Description of the Related Art

In the construction of integrated circuit structures on semiconductor substrates, the substrate is normally secured to an underlying substrate support in a vacuum environment by one of two conventional means, an edge gripping mechanical clamping structure, or an electrostatic chuck.

While edge gripping mechanical clamping structures keep the substrate from slipping, i.e. keep the substrate from horizontally sliding or moving on the substrate support, such an edge gripping mechanical clamping structure does not flatten the substrate to the underlying substrate support. Since some substrates, such as single crystal silicon semiconductor wafers, are formed slightly convex, it is very important that the substrate be flattened against the substrate support during processing of the substrate, to prevent or inhibit problems with, for example, photolithography processing on the surface of the substrate.

However, the primary disadvantage of edge gripping or clamping mechanisms is that they may cause damage to the substrate during the exercise of mechanical force on the substrate. Furthermore, additional hardware is usually required to insert and extract the substrate to and from the clamping mechanism.

While the problems of mechanical damage to the substrate and positioning the substrate to lie flat on the substrate support are not encountered as often when using an electrostatic chucking mechanism, there are many disadvantages distinctive to electrostatic chucks as well, including high voltage requirements, dangerous stored energy, the need for complex mechanical and electrical apparatus, premature release of the substrate in vacuum, dependance on the substrate for chucking effectiveness, expense of the equipment, large size (both in weight (heavy) and dimensions. (wide)), particle generation, and decreased substrate throughput.

It would, therefore, be desirable to provide a substrate retention mechanism which would permit a substrate to be secured to a substrate support without encountering the problems just discussed relating to either mechanical clamping of the substrate to the substrate support or electrostatic clamping of the substrate to the substrate support.

Autumn et al., in an article entitled "ADHESIVE FORCE OF A SINGLE GECKO FOOT-HAIR", which appeared in volume 405 of Nature on Jun. 8, 2000, at pages 681–685, reported that a gecko lizard's foot, such as shown, for example, at 2 in prior art FIG. 1, has nearly five hundred thousand keratinous hairs or setae, such as shown, for example, at 4 in prior art FIG. 2. Each such seta is said to be only about one-tenth the diameter of a human hair. The authors further state that each seta has, at its terminus, hundreds of projections or split ends, each terminating in 0.2–0.5 $\mu$m spatula-shaped structures such as shown, for example, at 6 in prior art FIG. 3. The authors indicate that the setae of the gecko foot apparently adhere to surfaces by Van der Waals forces, and that individual setae were measured and each seta was found to exert a force of about 194±25 $\mu$Newtons ($\mu$N).

Subsequently, an unsigned article appeared in the August, 2000 MRS Bulletin entitled "GECKO FOOT HAIR RESEARCH FEEDS ADHESIVE DEVELOPMENTS" which indicated that measurements of the force of individual foot hairs (setae) of geckos have resulted in estimates of a Van der Waals force ranging from about 40 $\mu$N to 400 $\mu$N per seta.

An article by Glennda Chui appearing in the San Jose Mercury News on Jun. 13, 2000, entitled "CLIMBING THE WALLS GECKOS SECRET OFFERS POTENTIAL FOR ADVANCES IN ADHESIVES, ROBOTICS AND CHIP-MAKING", also described the forces developed by the hairs on a gecko's foot and then, after commenting upon the possible use of this discovery in forming new dry adhesives, further suggested the use of such technology in moving silicon chips and other electronic components around during manufacture without risk of scratching.

SUMMARY OF THE INVENTION

A process and apparatus is disclosed capable of removably adhering a semiconductor substrate to a substrate support in a sub-atmospheric environment using a plurality of individual fibers, each mounted at one end adjacent the substrate support. When the portions of the fiber adjacent the loose fiber ends are each brought into contact with the under surface of the substrate, Van der Waals forces are exerted between the substrate and the fibers to urge the substrate toward the underlying substrate support. In a preferred embodiment, the substrate and portions of the fiber adjacent the loose fiber ends are first vertically brought into physical contact with one another, and then a horizontal force is applied to horizontally move, with respect to one another, the substrate and the portions of the fibers adjacent the loose fiber ends. After application of the horizontal force, a vertical force is applied between the substrate and the fibers of sufficient strength to urge the substrate and the fibers away from one another without breaking contact between the substrate and the portions of the fiber adjacent the fiber ends to thereby place tension on the substrate to urge the substrate to lie flat against the underlying substrate support.

DETAILED DESCRIPTION OF THE INVENTION

The invention comprises a process and apparatus capable of removably adhering a semiconductor substrate over a substrate support in a sub-atmospheric environment wherein a plurality of individual fibers mounted adjacent the top surface of the substrate support each contact the under surface of the substrate and exert Van der Waals forces on the substrate to urge the substrate toward the underlying substrate support.

a. The Fibers Used in the Invention

The fibers used in the process and apparatus of the invention which will be described below may comprise naturally occurring hairs harvested from the gecko lizard or they may comprise artificial inorganic or organic fibers. Inorganic fibers, for example, could include fibers made from dendrites or whiskers grown from/on inorganic crystals, e.g., zinc dendrites. Alternatively the fibers could comprise organic fibers extruded or spun from organic polymers and cut to the desired size. Such sizing apparatus could include means for imparting a flat end to the fibers similar to the flat ends (spatula-like ends) found on the ends of the gecko lizard hairs or setae.

b. First Embodiment of Invention

Figure 1:
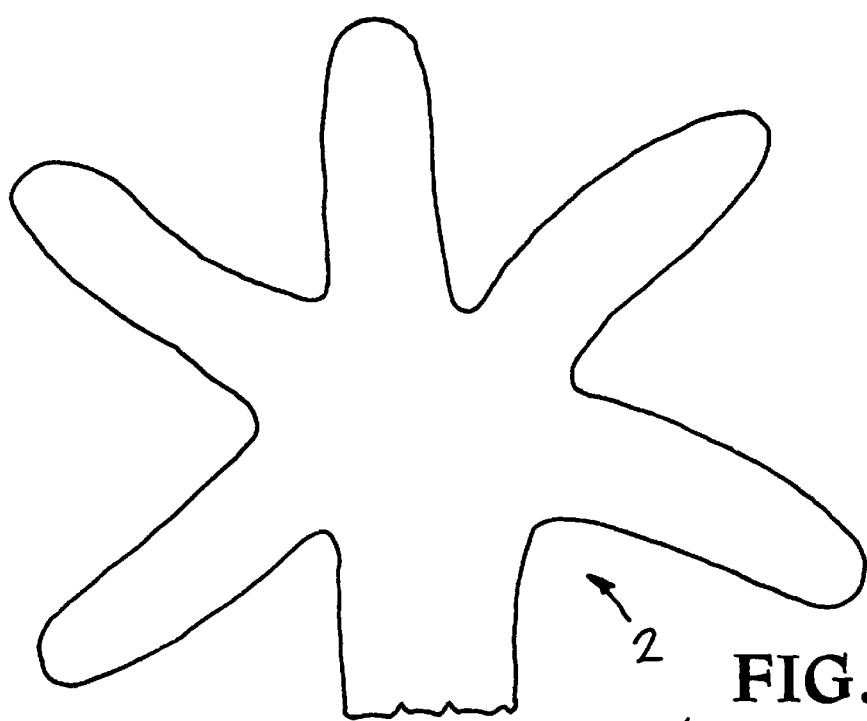
FIG. 1 is a prior art plan view of a five toe foot of a gecko.
Figure 2:
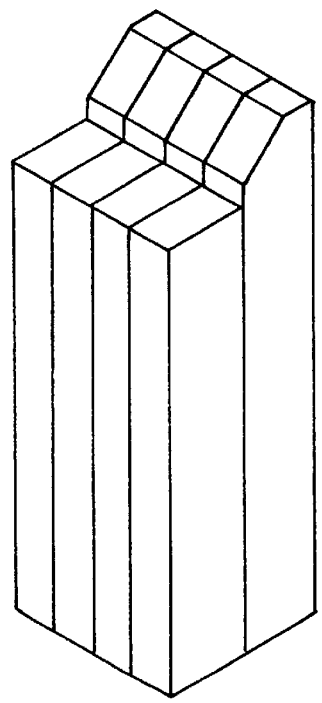
FIG. 2 is a prior art fragmentary isometric view of a portion of the rows of hairs (setae) on one toe of the gecko foot shown in FIG. 1.
Figure 3:
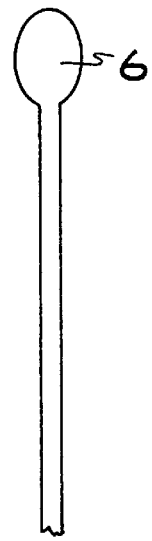
FIG. 3 is a prior art fragmentary view showing the spatula-like configuration formed on the end of each seta of the rows of setae depicted in FIG. 2.
Figure 4A:
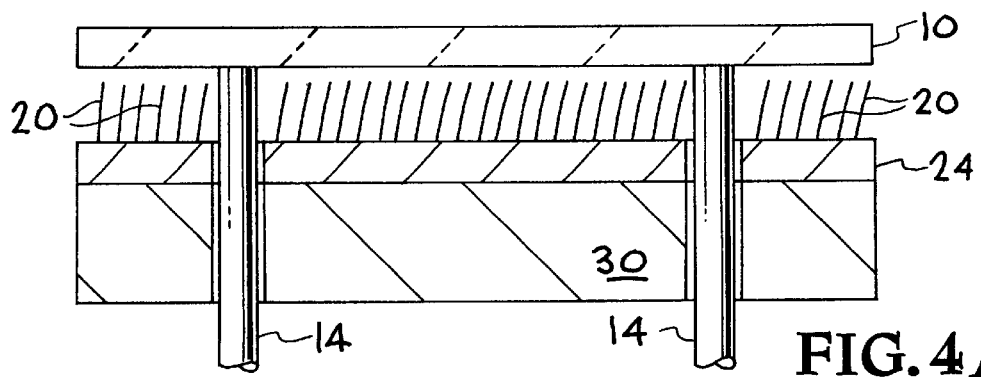
FIG. 4A is a fragmentary vertical side view of an apparatus constructed in accordance with the invention in its simplest form, with the fibers and substrate shown in non-engagement.
Figure 4B:
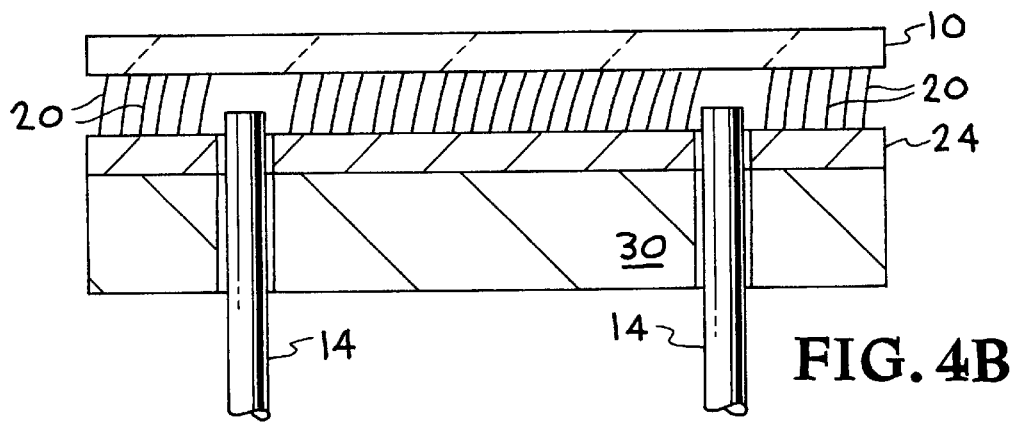
FIG. 4B is a fragmentary vertical side view of the apparatus of FIG. 4A, with the fibers and substrate shown engaged.

Turning to FIGS. 4A and 4B, the invention, in its simplest form, is illustrated wherein a substrate 10 is shown, in FIG. 4A, resting on withdrawable ejection pins 14 over a substrate support 30 within a processing chamber such as a vacuum chamber (not shown). A plurality of fibers 20 below substrate 10 (and shown in both enlarged length and diameter for illustrative purposes only) are secured to a mounting plate 24 which, in turn, is mounted on substrate support 30. Fibers 20 are shown, in FIG. 4A, just barely touching or out of touch with the under surface of substrate 10.

When pins 14 are retracted, as shown in FIG. 4B, substrate 10 comes into contact with and rests on all of the tops of fibers 20 which then act to secure substrate 10 to substrate support 30 through the contact between substrate 10 and fibers 20 and the securement of mounting plate 24 to substrate support 30. Substrate 10 is then processed in the vacuum chamber while substrate 10 remains secured to substrate support 30 through fibers 20.

After processing of substrate 10 has concluded, retractable pins 14 are again returned to their extended position illustrated in FIG. 4A to thereby lift substrate 10 off of and largely out of contact with fibers 20. The substrate is then engaged by conventional substrate handling mechanism such as a robotic arm (not shown) to transport substrate 10 to the next substrate processing stage.

c. Preferred Embodiment of Process of the Invention

While the foregoing describes the invention in its most elementary form, it has been found that a more stable securement of fibers such as fibers 20 to the undersurface of a substrate such as substrate 10 can be achieved if, in addition to the vertical movement used to bring the fibers and the substrate into contact, a horizontal movement is also imparted to slide the loose ends of the fibers along the under surface of the substrate as well. This combination of both horizontal and vertical movement is particularly beneficial when the loose ends of the fibers are formed with broadened or spatula-shaped segments, as is true of the individual seta of the gecko lizard.

This type of movement or motion, i.e., providing both horizontal and vertical movement, may be likened (in part) to the movement of a paint brush on a substrate surface wherein vertical motion is first used to bring the bristles of the paint brush into contact with the surface to be wiped (painted). During such vertical motion the bristles are slightly bent or flexed against the surface to be wiped (painted). Horizontal motion is then imparted to the brush to wipe (paint) the surface. However, unlike the paint brush which is then completely removed from the surface in a downward vertical movement at the end of the horizontal movement, in accordance with the invention, only a small downward vertical movement is applied to the fibers which is sufficient to move the fibers in a direction away from the substrate surface, but insufficient to break the contact between the fibers and the substrate so as to create a downward tension or pull against the under surface of the substrate to thereby urge the substrate toward or against the substrate support.

It should be noted in this regard that while it appears from FIGS. 4A and 4B that substrate 10 is spaced some distance above substrate support 30, this distance (which is approximately the length of the portion of fibers 20 extending above substrate support 30) may be, in reality, very small, i.e., as small as 100 nanometers (nm) if the fiber mounting plate is located in or below a slot provided in the substrate support, as will be described below. Thus, this small amount of vertical tension exerted by the fibers against the under surface of the substrate can be sufficient to bring the substrate downward into contact with the upper surface of the substrate support.

d, Apparatus For Carrying Out Preferred Process of the Invention

Referring now to FIGS. 5–8, an apparatus will be described which is capable of carrying out the preferred process of the invention by providing both vertical and horizontal motion to a plurality of fibers secured to mounting plates arranged in symmetrical fashion in slots in a substrate support cover plato thereby secure a semiconductor substrate to a substrate support.

Figure 5:
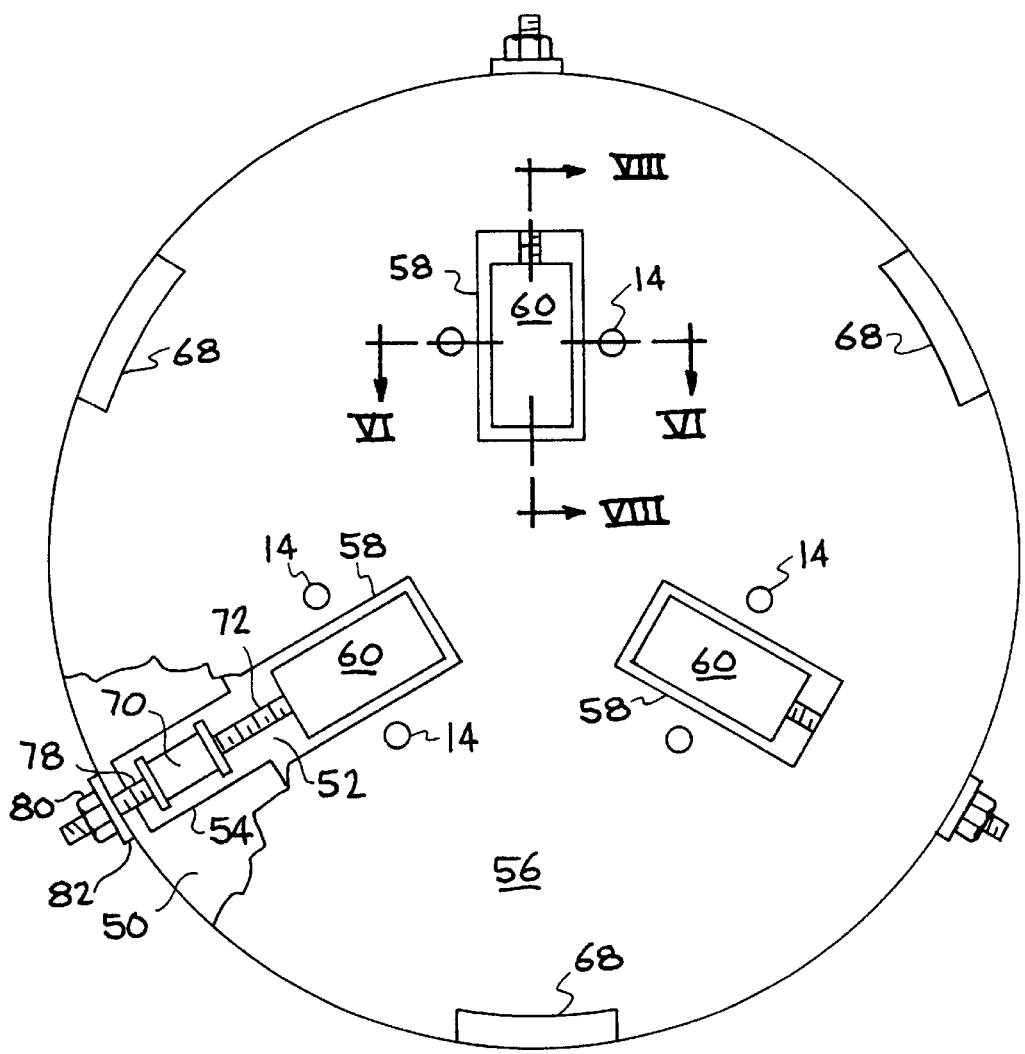
FIG. 5 is a partially cut-away top view of a substrate support provided with the clamping mechanism of the invention.
Figure 6:
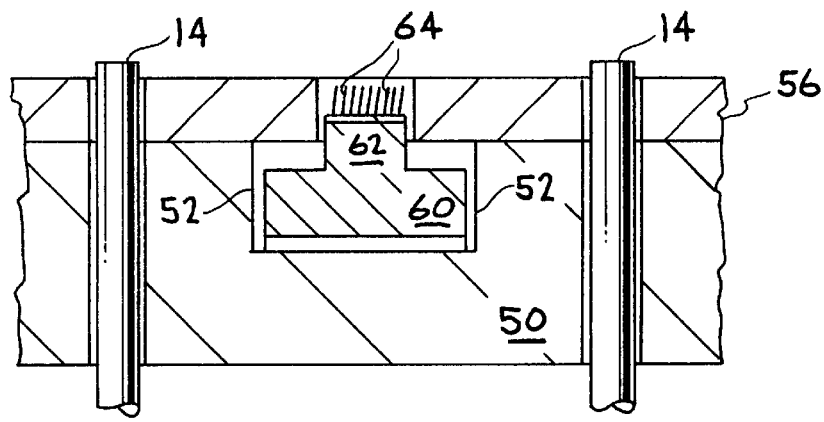
FIG. 6 is a fragmentary vertical side section view of a portion of the clamping mechanism shown in FIG. 5 taken along lines VI—VI.

A substrate support is shown in FIGS. 5 and 6 comprising a substrate support base 50 covered by a substrate cover plate 56. Substrate support base 50 is provided with three symmetrically spaced apart large-width grooves or slots 52 radiating in spoke-like fashion from adjacent the center of substrate support 50. Each groove 52 receives a T-shaped fibrous substrate-mounting mechanism 60 which will secure the substrate to substrate support base 50, as will be explained below. The number of such grooves 52 is not crucial as long as there are sufficient grooves to uniformly urge the substrate toward the upper surface of substrate support cover plate 56. Aligned respectively with each groove 52 is a smaller width groove or slot 54 in substrate support base 50 which receives the mechanism for imparting horizontal movement to fibrous substrate-mounting mechanism 60, as will also be explained below. Support cover plate 56 is secured to the upper surface of substrate support base 50 over grooves 52 and 54 in substrate support base 50. Substrate support cover plate 56 is provided with slotted openings 58 in registry with large-width grooves 52 to permit the fibers of fibrous substrate-mounting mechanism 60 to protrude therethrough, as will be explained below.

As best seen in FIG. 6, slidably received in each large-width groove 52 in substrate support base 50 is a T-shaped fibrous substrate-mounting mechanism 60. T-shaped mechanism 60 is mounted in groove 52 in inverted fashion with the center leg 62 of T-shaped mechanism 60 facing upward and having mounted thereon an array of fiber material 64 to engage the under surface of substrate 10, as will be explained below.

The depth of large-width groove 52 in substrate support base 50 is dimensioned, with respect to the thickness of substrate support cover plate 56 thereover, the height of T-shaped mechanism 60 slidably received in groove 52, and the height of fibers 64 mounted on the top of center leg 62 of T-shaped mechanism 60, to position the tops of fibers 64 in slotted openings 58 of cover plate 56 just below the top surface of cover plate 56 when T-shaped mechanism 60 is in its at rest position as will be explained.

Fibrous substrate-mounting mechanism 60, as shown in FIG. 5, is attached at one end to a shaft 72 of a bellows mechanism 70.

As also seen in FIG. 5, this embodiment may also be provided with ejection pins 14 to assist in initially supporting substrate 10 above substrate support cover plate 56, as well as in subsequent removal of substrate 10. Optional raised rim segments 68 may also be provided on the periphery of the upper surface of substrate support cover plate 56 to horizontally secure the substrate to cover plate 56 prior to complete engagement of the substrate by the mechanism of the invention.

Figure 7A:
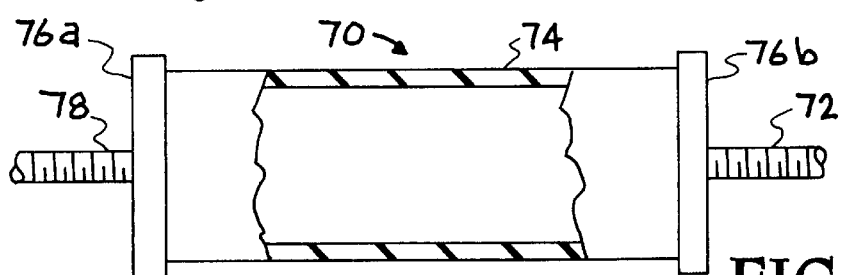
FIG. 7A is a vertical side section view of a bellows mechanism used to impart horizontal movement to the clamping mechanism of the invention of FIG. 5, showing the bellows mechanism in its inactivated state.
Figure 7B:
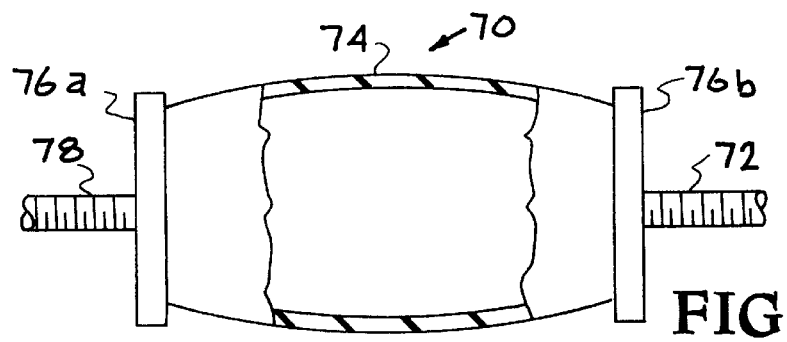
FIG. 7B is a vertical side section view of the bellows mechanism of FIG. 7A, but shown in its activated state.

Turning now to FIGS. 7A and 7B, bellows mechanism 70, which is used to impart horizontal movement to T-shaped mechanism 60 as will be described below, is received in groove 54 in substrate support base 50. Bellows mechanism 70 may comprise a cylindrical elastomeric tube 74 attached and hermetically sealed respectively at its opposite ends to end plates 76a and 76b. Endplate 76a is attached to a threaded shaft 78 which secures bellows mechanism 70 to substrate support plate 50 through a nut 80 and washer 82 which is larger in diameter than groove 54. Threaded shaft 72, attached at one end to endplate 76b of bellows mechanism 70, is attached at its opposite end to an end of T-shaped fibrous substrate-mounting mechanism 60 facing bellows mechanism 70. Thus, shaft 72 couples bellows mechanism 70 to T-shaped fibrous substrate-mounting mechanism 60.

When the space within bellows mechanism 70 defined by elastomeric tube 74 and end plates 76a and 76b sealed thereto is at atmospheric pressure, and the environment surrounding bellows mechanism 70 is also at atmospheric pressure, elastomeric tube 74 is in an unexpanded state, as shown in FIG. 7A. However, if bellows mechanism 70 is placed in a sealed chamber (not shown) which is then evacuated, the pressure within the space defined by elastomeric tube 74 and end plates 76a and 76b sealed thereto causes elastomeric tube 74 to expand, as shown in FIG. 7B. This, in turn causes the distance between end plates 76a and 76b to change (shorten) as elastomeric tube 74 expands. When endplate 76a of bellows mechanism 70 is rigidly secured via shaft 78 to substrate support base 50, as described above, the result is movement of endplate 76b and threaded shaft 72 thereon. Since threaded shaft 72 is, in turn, attached to T-shaped fibrous substrate-mounting mechanism 60, the expansion of elastomeric tube 74 causes T-shaped fibrous substrate-mounting mechanism 60 to slide in groove 52 toward bellows mechanism 70, i.e., imparts horizontal movement to T-shaped fibrous substrate-mounting mechanism 60. This horizontal movement of T-shaped fibrous substrate-mounting mechanism 60, coupled with a camming mechanism to be discussed below, will simultaneously also impart vertical movement to T-shaped fibrous substrate-mounting mechanism 60 as well.

Figure 8A:
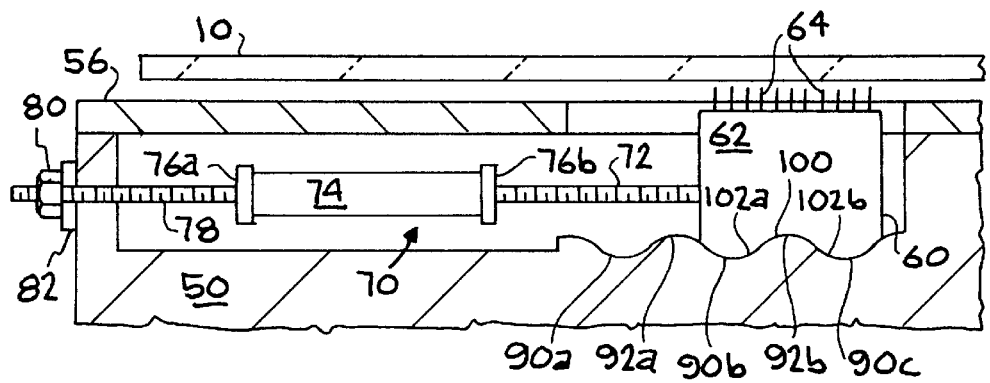
FIG. 8A is a fragmentary vertical side section view of a portion of the clamping mechanism of FIG. 5 taken along lines VIII—VIII, showing the matching cam surfaces on the substrate support and the undersurface of the clamping mechanism, with the clamping mechanism shown in FIGS. 5 and 6 in an at rest position, with the bellows mechanism of FIG. 7 inactivated, and the fibers not in contact with the under surface of a substrate shown over the clamping mechanism of the invention.
Figure 8B:
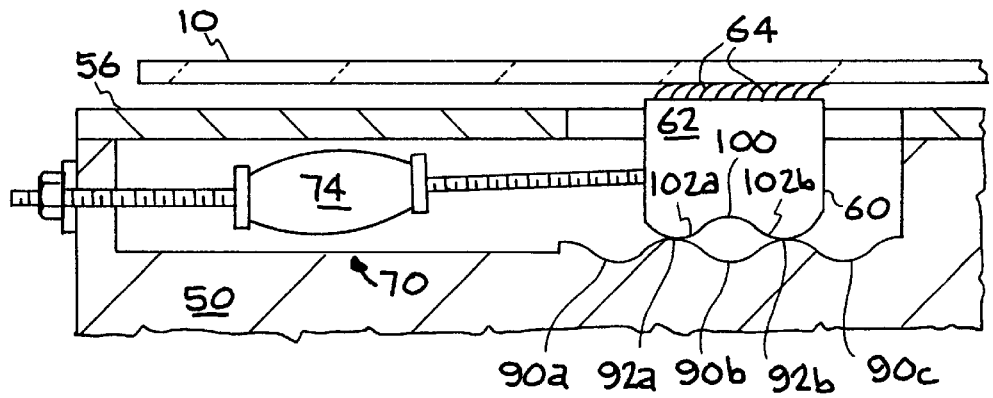
FIG. 8B is a fragmentary vertical side section of the clamping structure of FIG. 8A but with the clamping mechanism in a partially activated position, i.e., with the bellows mechanism of FIG. 7 partially activated and the fibers in contact with the under surface of the substrate.
Figure 8C:
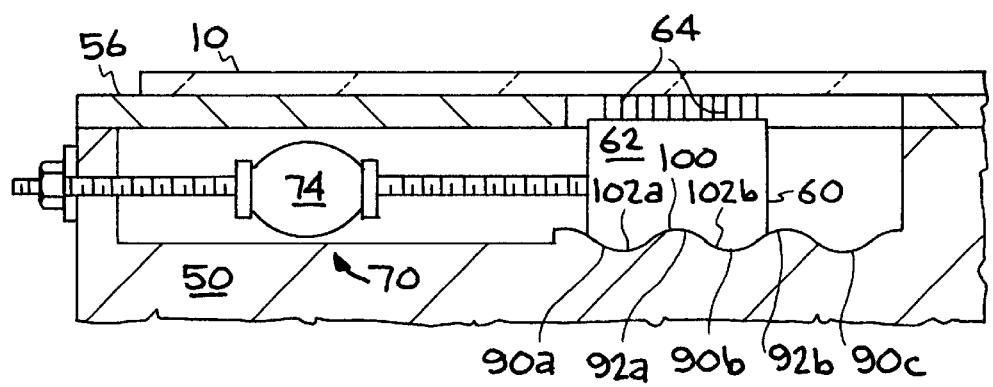
FIG. 8C is a fragmentary vertical side section of the structure of FIGS. 8A and 8B, but in a fully activated position, i.e., with the bellows mechanism of FIG. 7 fully activated and the fibers in contact with the under surface of the substrate, with tension being exerted between the fibers and the substrate.

FIGS. 8A–8C illustrate the combined horizontal and vertical movement imparted to T-shaped fibrous substrate-mounting mechanism 60 and to fibers 64 mounted to upper leg 62 thereon. In this side-section view, it will be seen that the lower surface of T-shaped fibrous substrate-mounting mechanism 60 and a portion of the upwardly facing bottom surface of large-width groove 52 in substrate support base 50 comprise cam surfaces which impart vertical motion to T-shaped fibrous substrate-mounting mechanism 60 with respect to substrate support plate 50 when T-shaped fibrous substrate-mounting mechanism 60 is moved horizontally by bellows mechanism 70. The cam surfaces in the bottom of groove 52 of substrate support base 50 comprise a continuous curved surface having depressed portions 90a, 90b, and 90c, separated from one another by raised portions 92a and 92b. Matching cam surfaces on the underside of T-shaped fibrous substrate-mounting mechanism 60 comprise a continuous curved surface having a raised portion 100 between downwardly protruding portions 102a and 102b. It should be noted that the cam surfaces may comprise assymetrical curves to help facilitate release or capture of substrate 10 by fibers 64.

When substrate 10 is first placed over the structure, as shown in FIG. 8A (e.g., on pins 14 not shown in FIG. 8A, but shown in FIG. 6), it will be noted that substrate 10 rests over, but not in contact with, the ends of underlying fibers 64 mounted on upper leg 62 of T-shaped fibrous substrate-mounting mechanism 60.

At this point bellows mechanism 70 is not activated and T-shaped fibrous substrate-mounting mechanism 60 is at its at rest position over substrate support cover plate 56 with downwardly protruding cam surfaces 102a and 102b on the undersurface of T-shaped fibrous substrate-mounting mechanism 60 in respective contact with depressed portions 90b and 90c in groove 52 of substrate support base 50, and raised portion 100 of T-shaped fibrous substrate-mounting mechanism 60 resting on raised portion 92b of groove 52.

When the entire structure, including bellows mechanism 70, is mounted in a sealed chamber (not shown) which is then partially evacuated, the elastomeric tube 74 of bellows mechanism 70 begins to swell, as shown in FIG. 8B. This, in turn, causes endplate 76b and shaft 72 to pull T-shaped fibrous substrate-mounting mechanism 60 toward bellows mechanism 70, causing downwardly depending cam surfaces 102a and 102b of T-shaped fibrous substrate-mounting mechanism 60, to slide to the left up the slopes of the cam surfaces in groove 52 to rest on the peaks of raised portions 92a and 92b in groove 52 of substrate support base 50. The vertical motion imparted to T-shaped fibrous substrate-mounting mechanism 60 by the movement of the respective cam surfaces of T-shaped fibrous substrate-mounting mechanism 60 over the respective cam in groove 52 of underlying substrate support base 50, causes fibers 64 to be raised into contact with the underlying surface of substrate 10. At the same time, the horizontal movement simultaneously being imparted to T-shaped fibrous substrate-mounting mechanism 60 cause fibers 64 to be dragged or wiped across the undersurface of substrate 10, to increase the contact between the ends of fibers 64 and the undersurface of substrate 10 to thereby increase the Van der Waals forces of attraction being developed between fibers 64 and substrate 10.

Turning now to FIG. 8C, it will be noted that as the sealed chamber continues to be evacuated, elastomeric tube 74 of bellows mechanism 70 continues to swell to impart further horizontal movement to T-shaped fibrous substrate-mounting mechanism 60, thereby causing downwardly protruding cam surfaces 102a and 102b of T-shaped fibrous substrate-mounting mechanism 60 to slide into depressed cam surfaces 90a and 90b on substrate support base 50, thereby imparting a downward movement to T-shaped fibrous substrate-mounting mechanism 60. This, in turn, causes fibers 64 to be pulled downwardly, causing tension to develop between fibers 64 and substrate 10. This developed tension causes substrate 10 to be urged downward against the upper surface of cover plate 56 over substrate support base 50 to thereby rest flatly against cover plate 56 of substrate support base 50. Whatever conventional processing is desired can now be carried out on flatly clamped substrate 10.

It should be noted that the downward pulling of fibers 64 to create tension between fibers 64 and the undersurface of substrate 10 must not be sufficient to break the bond between fibers 64 and substrate 10 created by the Van der Waals forces, but merely sufficient to cause the desired flattening of substrate 10 against the upper surface of substrate support cover plate 56. This amount of downward travel in the third step depicted in FIG. 8C may be controlled by adjustment of the height of fibers 64, the height of center leg 62 of T-shaped fibrous substrate-mounting mechanism 60, or the depth of depressed portions 90a and 90b of the cam surface at the bottom of groove 52 in substrate support base 50.

After the desired processing of substrate 10 has concluded, and unclamping of substrate 10 is required, the pressure around the outside wall of elastomeric tube 74 may be increased, thereby causing the previously described clamping process to be reversed. That is, the reverse horizontal movement, of T-shaped fibrous substrate-mounting mechanism 60 away from bellows mechanism 70, is now induced by the retraction of elastomeric tube 74.

It should be noted in this regard that the horizontal movement of T-shaped fibrous substrate-mounting mechanism 60 (to impart vertical movement to T-shaped fibrous substrate-mounting mechanism 60 toward and away from substrate 10 by the interaction of the cam surfaces in the bottom of groove 52 in substrate support base 50 and T-shaped fibrous substrate-mounting mechanism 60) can be carried out by other means than bellows mechanism 70. Such includes, for example, a solenoid located outside of the reaction chamber and coupled to T-shaped fibrous substrate-mounting mechanism 60 either magnetically or mechanically, through a shaft passing through a sealed opening in the reactor wall. The horizontal/vertical movement could also be carried out with bellows mechanism 70 located in an isolated chamber wherein the pressure or vacuum surrounding bellows mechanism 70 would be independent of the pressure in the reaction chamber where substrate 10 is mounted.

Figure 9:
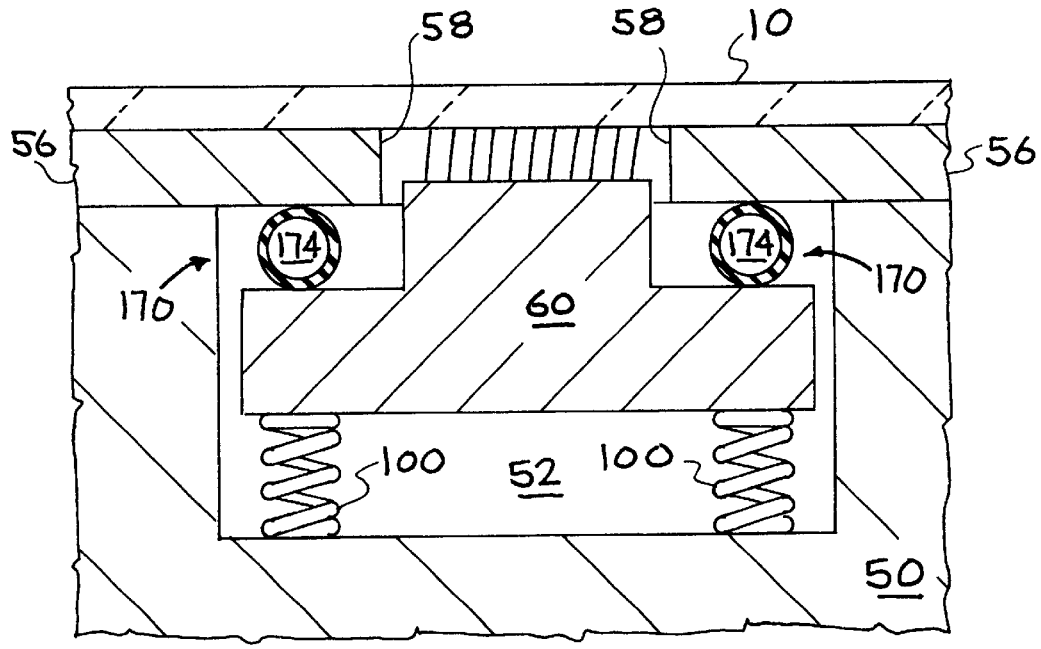
FIG. 9 is a fragmentary vertical cross sectional view of yet another embodiment of the invention wherein activation of the bellows mechanism is used to provide vertical movement to provide tension on the substrate as the bellows mechanism is activated.

Horizontal and vertical movement may also be imparted to T-shaped fibrous substrate-mounting mechanism 60 without the use of the above described camming mechanism. For example, the original upward vertical movement of T-shaped fibrous substrate-mounting mechanism 60 to engage the under surface of substrate 10 may be provided by positioning one or more springs 100 in large-width groove 52 beneath T-shaped fibrous substrate-mounting mechanism 60, as shown in FIG. 9. The horizontal movement of T-shaped fibrous substrate-mounting mechanism 60 to "wipe" the ends of fibers 64 across the under surface of substrate 10 could then be carried out using a solenoid operationally attached to T-shaped fibrous substrate-mounting mechanism 60. The downward vertical movement of T-shaped fibrous substrate-mounting mechanism 60 away from the under surface of substrate 10 to provided the desired tension between fibers 64 and substrate 10 to flatten substrate 10 against cover plate 56 could then be accomplished by horizontally positioning bellows mechanisms 170 between the undersurface of cover plate 56 and the upper surfaces of the horizontal legs of T-shaped fibrous substrate-mounting mechanism 60, as also shown in FIG. 9. Activation of bellows mechanisms 170 (by evacuation of the chamber in which the clamping mechanism of the invention is mounted) would then urge T-shaped fibrous substrate-mounting mechanism 60 downward, against the tension of springs 100, as elastomeric tube 174 of bellows mechanism 170 expanded.

Thus the invention provides a process and apparatus for securing a substrate such as a semiconductor wafer to a substrate support structure without using either mechanical clamping of the substrate to the substrate support and without the use of an electrostatic clamping structure. The problems of mechanical damage to the substrate and positioning the substrate to lie flat on the substrate support encountered with mechanical clamping are thereby avoided as are the problems associated with electrostatic clamping.

While the invention has been described and illustrated with respect to certain embodiments preferred at present, the invention should be limited only by the scope of the following claims.

What is claimed is:

1. A process of removably adhering a semiconductor substrate to a substrate support in an environment capable of operating at sub-atmospheric pressure, comprising:

a) providing a plurality of individual fibers, each of said fibers operationally connected at one end to said substrate support, and each of said fibers having an opposite free end;

b) positioning said semiconductor substrate vertically spaced above said free ends of said fibers; and c) bringing a surface defined by said free ends of said fibers and an under surface of said semiconductor substrate into direct contact with one another by decreasing said vertical spacing between said free ends of said fibers and said under surface of said semiconductor substrate until direct contact with one another is established; and d) imparting horizontal movement between said free ends of said fibers and said under surface of said semiconductor substrate after said contact has been established to thereby cause the ends of said fibers to slide over said under surface of said semiconductor substrate;

whereby said free fiber ends and said under surface of said semiconductor substrate brought into contact with one another results in binding forces exerted between said semiconductor substrate and said fibers to urge said semiconductor substrate against said underlying substrate support.

2. The process of claim 1 where said free ends of said fibers which slide over said under surface of said semiconductor substrate have spatula-shaped structures adjacent said free ends to increase said surface area of said free ends of said fibers in contact with said under surface of said semiconductor substrate during said horizontal movement.

3. The process of claim 2 wherein said fibers having spatula-shaped structures adjacent said free ends comprise lizard foot hairs.

4. The process of claim 2 wherein said fibers having said spatula-shaped structures adjacent said free ends comprise artificial fibers.

5. The process of claim 4 wherein said artificial fibers having said spatula-shaped structures adjacent said free ends comprise inorganic artificial fibers.

6. The process of claim 4 wherein said artificial fibers having said spatula-shaped structures adjacent said free ends comprise organic artificial fibers.

7. The process of claim 1 wherein said step of positioning said semiconductor substrate above said free ends of said fibers further comprises lowering said semiconductor substrate onto retractable substrate support pins retractably mounted in the upper surface of said substrate support and upwardly protruding a distance greater than the height of said fibers; and said step of bringing said free ends of said fibers and an under surface of said semiconductor substrate into contact with one another further comprises retracting said substrate support pins until said free ends of said fibers contact said under surface of said semiconductor substrate.

8. A process of removably adhering a semiconductor substrate to free ends of a plurality of individual fibers which are each secured at an opposite end to a first portion of a substrate support mechanism mounted in an environment capable of operating at sub-atmospheric pressure comprising:

a) providing said plurality of individual fibers, each of said fibers having a free end and mounted at said opposite end to said first portion of said substrate support, said fibers having spatulalike portions adjacent said free ends;

b) bringing said free ends of said fibers and an under surface of said semiconductor substrate over said substrate support into contact with one another by reducing the vertical spacing between said substrate and said free ends of said fibers; and c) thereafter, horizontally moving said free ends of said fibers, including said spatula-shape structures adjacent said free ends of said fibers, across said under surface of said semiconductor substrate;

whereby Van der Waals forces of attraction are established between said under surface of said semiconductor substrate and said free ends of said fibers.

9. The process of claim 8 including the subsequent step of vertically moving said fibers and said substrate away from one another a distance sufficient to create tension between said fibers and said substrate to draw said substrate downwardly toward said substrate support, but insufficient to break the bonds established between said substrate and said fibers during said previous horizontal moving step.

10. The process of claim 9 wherein said fibers comprise hairs of a gecko lizard foot which are secured to said first portion of said substrate support.

11. The process of claim 9 wherein said step of bring said free ends of said fibers and said under surface of said semiconductor substrate into contact with one another further includes vertically moving, relative to remaning portion of said substrate support, said first portion of said substrate support to which said fibers are secured until said free ends of said fibers contact said under surface of said substrate.

12. The process of claim 9 wherein said step of horizontally moving said free ends of said fibers across said under surface of said semiconductor substrate further includes horizontally moving, relative to remaning portion of said substrate support, said first portion of said substrate support to which said fibers are secured.

13. The process of claim 9 wherein said step of vertically moving said free ends of said fibers and said under surface of said semiconductor substrate away from one another further includes vertically moving, relative to remaining portion of said substrate support, said portion of said substrate support to which said fibers are secured.

14. An apparatus for removably adhering a semiconductor substrate to a substrate support in an environment capable of operating at sub-atmospheric pressure, which comprises:

a) said substrate support;

b) a plurality of individual fibers, each of said fibers operationally connected at one end to said substrate support, and each of said fibers having an opposite free end;

c) means for positioning said semiconductor substrate above said free ends of said fibers; and d) means for bringing said free ends of said fibers and an under surface of said semiconductor substrate into contact with one another;

whereby said free fiber ends and said under surface of said substrate are brought into contact with one another to cause binding forces to be exerted between said semiconductor substrate and said fibers to urge said semiconductor substrate against said underlying substrate support.

15. The apparatus of claim 14 wherein said means for positioning a semiconductor substrate above said free ends of said fibers includes vertically retractable pins mounted in said substrate support.

16. The apparatus of claim 14 wherein said means for bringing said free ends of said fibers and an under surface of said semiconductor substrate into contact with one another further includes means for vertically moving said fibers toward said under surface of said semiductor substrate.

17. The apparatus of claim 14 which further comprises means for moving said loose ends of said fibers horizontally across said under surface of said semiconductor substrate.

18. The apparatus of claim 17 which further comprises means for moving said loose ends of said fibers and said semiconductor substrate vertically away from one another, after moving said loose ends of said fibers horizontally across said under surface of said semiconductor substrate, a distance sufficient to create tension between said fibers and said substrate to draw said substrate downwardly toward said substrate support, but insufficient to break the bonds previously established between said substrate and said fibers.

19. The means claim 18 wherein said apparatus for imparting horizontal and vertical movement to said fibers relative to said semiconductor substrate include a retractable bellows mechanism which swells in one dimension and contracts in another dimension in response to changes in external pressure.

20. The apparatus of claim 19 wherein said bellows mechanism imparts vertical and horizontal movement to said fibers by moving over cam surfaces said portion of said substrate support to which said fibers are operationally connected.

* * * * *